United States Patent

Adoncecchi et al.

[11] Patent Number: 5,141,613
[45] Date of Patent: Aug. 25, 1992

[54] SILICON CARBIDE COATINGS

[75] Inventors: Valerio Adoncecchi, Monterotondo; Emilia Cappelli, Mentana; Giuseppe Giunta, Trento; Antonio Parretta, Rome, all of Italy

[73] Assignee: Eniricerche S.p.A., Milan, Italy

[21] Appl. No.: 664,926

[22] Filed: Mar. 5, 1991

[30] Foreign Application Priority Data

Mar. 9, 1990 [IT] Italy ................. 19627 A/90

[51] Int. Cl.$^5$ ............... C23C 16/30; C23C 16/32; C23C 16/34
[52] U.S. Cl. ............... 204/192.1; 427/248.1; 427/249; 427/255.1; 427/255.7; 204/192.15
[58] Field of Search ............. 427/255.7, 38, 39, 249, 427/255.1; 204/192.1

[56] References Cited

U.S. PATENT DOCUMENTS

| 4,399,168 | 8/1983 | Kullander et al. | 427/255.7 |
| 4,569,862 | 2/1986 | Arai et al. | 427/255 |
| 4,746,563 | 5/1988 | Nakano et al. | 428/216 |
| 4,869,929 | 9/1989 | Cabrera et al. | 427/249 |
| 4,895,770 | 1/1990 | Schintlmeister et al. | 428/552 |
| 4,946,712 | 8/1990 | Goodman et al. | 427/166 |

FOREIGN PATENT DOCUMENTS

| 2590594 | 5/1987 | France . |
| 56208 | 6/1981 | Japan . |
| 60-177179 | 9/1985 | Japan . |
| 2107742 | 5/1983 | United Kingdom . |

Primary Examiner—Shrive Beck
Assistant Examiner—Bret Chen
Attorney, Agent, or Firm—Shea & Gould

[57] ABSTRACT

A process is described for forming a silicon carbide coating on nickel-based superalloys by:
nitriding the alloy or depositing a titanium nitride film on the alloy by reactive sputtering;
vapor-phase chemical deposition of a thin film of titanium nitride;
annealing in a nitrogen and hydrogen atmosphere;
vapor-phase chemical deposition of a silicon carbon layer.

7 Claims, No Drawings

SILICON CARBIDE COATINGS

This invention relates to a method for coating nickel-based superalloys with silicon carbide.

After an initial development in the 1930s as materials for gas turbine components, nickel-based superalloys have seen their field of application extended to space vehicles, nuclear reactors and the new high-speed diesel engines.

The use of these superalloys in engines operating at high temperature has resulted in new problems connected with heat dispersion, oxidation, corrosion, erosion and friction.

One system for protecting these materials is to coat the surfaces with a specific protective layer.

Of all possible coatings, the ceramics and in particular carbides and nitrides are those which offer the best protection against the aforelisted drawbacks and in addition have the advantage of not requiring or at least reducing liquid lubricants.

It is however not easy to directly coat the superalloy with silicon carbide. The difference in thermal expansion and hardness between the superalloy and the silicon carbide are such as to not allow acceptable adhesion. In this respect, considerable states of tension are present at the interface to induce delamination.

In addition, a process for depositing silicon carbide directly on the superalloy at a temperature compatible with the superalloy itself using methyltrichlorosilane pyrolysis (see for example W. Schintlmeister et al., High Temp. High Press. vol 18, page 211 1986) does not lead to the formation of the desired product i.e. a silicon carbide-coated superalloy, but instead results in reaction of the silicon carbide with the surface elements and the formation of mixed silicides of nickel, chromium and titanium, which are thermodynamically more stable than silicon carbide. The result is the depletion of the elements nickel, chromium and titanium, and particularly nickel, from the substrate, with formation of porosity in the substrate due to such depletion.

A method is known in the art (T. Yamada et al. in Ceramic Materials and Components for Engines Proc. 2nd Int. Symp. Lubeck Apr. 14-17 1986 W. Bunk and H. Hasner Ed.) for bonding a ceramic coating to a substrate consisting of a nickel-based superalloy, using a high temperature and pressure diffusion process between the substrate and coating (diffusion bonding).

This process has the drawback of being complicated, of requiring high local pressure and therefore being difficult to apply to complicated shapes.

It has now been found that these drawbacks can be overcome by using a method comprising interposing a thin layer of titanium nitride between the protective silicon carbide outer layer and the alloy. The nitride is necessary to make the superalloy both chemically and mechanically compatible with the protective silicon carbide layer.

In accordance therewith, the present invention provides a process for forming a silicon carbide coating on nickel-based superalloys which comprises the following stages conducted in succession:
a) nitriding pretreatment of the superalloy or deposition of a film of titanium nitride on the superalloy by reactive sputtering;
b) vapour-phase chemical deposition of a thin film of titanium nitride;
c) annealing in a nitrogen and hydrogen atmosphere;
d) vapour-phase chemical deposition of a silicon carbide layer.

In stage a) the nitriding treatment is carried out in a hydrogen and nitrogen or ammonia atmosphere at a temperature of between 500° and 1000° C., or in nitrogen plasma at a temperature of about 500° C.

This type of surface treatment results in hardening of the substrate by the formation of chromium and titanium nitrides and facilitates the subsequent growth o the titanium nitride and its anchoring to the substrate.

In a further embodiment of the present invention, stage a) is carried out by reactive sputtering in which activated particles of argon and nitrogen strike a titanium target to extract strongly reactive atoms from it and thus form a microcrystalline layer of titanium nitride on the surface of the superalloy.

This nitride deposit facilitates subsequent deposition of the titanium nitride film of stage b).

With regard to stages b) to d) the entire process is conducted in a cold-wall vapour phase chemical deposition reactor. The stages are conducted in sequence at a temperature of between 950° and 1050° C. Under the preferred conditions the temperature is 1000° C.

The annealing (stage c) in a nitrogen atmosphere favours relaxation of the states of tension in the deposited nitride film.

The time required for the entire procedure, including initial heating and final slow cooling is about 12 hours. In particular, it is important for the cooling after stage d) to be slow and in any event not less than 4 hours.

The coatings obtained by this method are particularly reliable with regard to their adhesion to nickel-based superalloys, even of complex shape. The satisfactory adhesion of silicon carbide to Nimonic 80 makes these nickel-based superalloys particularly suitable for use in oxidizing and/or erosive environments at high temperature.

The following examples are provided to better illustrate the invention and are not to be considered as limitative thereof.

EXAMPLE 1

A nickel-based superalloy, Nimonic 80A, has the following composition: Ni 74.1%, Cr 19.5%, Co 1.1%, Al 1.3%, Ti 2.5%, Mn 0.1%, Si 0.7%, C 0.06%. A sheet of this material of size $15 \times 10 \times 1$ mm is treated in the following manner.

The specimen is polished to a mirror finish with diamond paste of up to one micron in particle size, cleaned with ultrasound in hot toluene, stored in hexane and then placed in a cold wall reactor for vapour phase chemical deposition.

a) Pretreatment of the substrate

After generating a vacuum of $10^{-2}$ Pa in the reactor, hydrogen is fed in to a pressure of $3.9 \times 10^4$ Pa. The specimen is heated to a temperature of 1000° C. over a time of about 2 hours by connection to a high frequency (450 KHz) generator. The hydrogen flow is then adjusted to 400 standard $cm^3$/min and nitrogen fed in for 30 minutes at a flow of 2000 standard $cm^3$/min.

b) Deposition of titanium nitride

While maintaining the temperature and total pressure constant, titanium tetrachloride is fed into the reactor. The total flow is 2400 standard $cm^3$/min, the molar fractions of titanium tetrachloride, nitrogen and hydrogen being $8 \times 10^{-4}$, 0.15 and 0.85 respectively.

The deposition time is about 1 hour and the film thickness is 2-3 microns.

c) Annealing

The titanium tetrachloride flow is shut off and the specimen is kept for one hour in a nitrogen and hydrogen stream alone. The temperature is again 1000° C.

d) Silicon carbide deposition

The nitrogen flow is shut off and argon is fed into the reactor. Methyltrichlorosilane is finally fed in, maintaining the pressure and temperature constant. The molar fractions of methyltrichlorosilane, hydrogen and argon are $2.4 \times 10^{-2}$, 0.24 and 0.76 respectively. The total flow is 820 standard cm$^3$/min and the deposition time about 2 hours.

The specimen is finally cooled slowly over a period of about 5 hours in a hydrogen and argon atmosphere.

Under these conditions a superalloy specimen is obtained coated with an intermediate layer of titanium nitride and an external layer of about 6-7 microns of silicon carbide.

The adhesion of the coating obtained in this manner to the substrate was evaluated by the scratch test. This test consists of sliding along the coating at constant speed a Rockwell diamond point with a radius of curvature of 200 microns. A force is applied to the point perpendicular to the surface and increases linearly with time, until the coating separates from the substrate when a certain load known as the critical load is reached. For our specimen, the measurement conditions were as follows: sliding speed of the point 10 mm/min; rate of load application 100N/min. Under these conditions the test gave critical loads of between 25 and 300N.

EXAMPLE 2

A Nimonic specimen is cleaned as described in Example 1 and then placed in a commercial reactive sputtering apparatus (Leybold 2400 - Magnetron sputtering).

The experimental conditions are as follows: total gas pressure 0.4 Pa, the inert gas is argon, the reactive gas is nitrogen at a partial pressure of 0.03-0.05 Pa, radiofrequency discharge 13.56 MHz, deposition time about 10 minutes, substrate temperature about 500° C.

Under these conditions a cubic, stoichiometric, microcrystalline titanium nitride layer is obtained with prevalent orientation (221).

The subsequent vapour-phase deposition of the titanium nitride and silicon carbide is identical to that described in stages b) to d) of Example 1.

The test for measuring the adhesion of the coating to the substrate was conducted under the conditions stated in Example 1 and gave a critical load of between 20 and 25N.

We claim:

1. A process for forming a silicon carbide coating on nickel-based superalloys, comprising the following stages conducted in succession:
   a) nitriding pretreatment of the superalloy or deposition of a film of titanium nitride on the superalloy by reactive sputtering;
   b) vapour-phase chemical deposition of a thin film of titanium nitride;
   c) annealing in a nitrogen and hydrogen atmosphere;
   d) vapour-phase chemical deposition of a silicon carbide layer; and cooling after stage d) for a time equal to or greater than 4 hours.

2. A process as claimed in claim 1, characterised in that the pretreatment of stage a) is effected in a nitrogen-hydrogen atmosphere.

3. A process as claimed in claim 1, characterised in that the pretreatment of stage a) is effected in an ammonia-hydrogen atmosphere.

4. A process as claimed in claim 1, characterised in that the pretreatment of stage a) is effected with nitrogen plasma.

5. A process as claimed in claim 1, characterised in that stage a) is effected by depositing a titanium nitride film by reactive sputtering.

6. A process as claimed in 1, characterised in that stages b) to d) take place at a temperature of between 950° and 1050° C.

7. A process as claimed in 1, characterised in that stages b) to d) take place at a temperature of 1000° C.

* * * * *